United States Patent [19]
Foerstner et al.

[11] Patent Number: 5,792,678
[45] Date of Patent: Aug. 11, 1998

[54] METHOD FOR FABRICATING A SEMICONDUCTOR ON INSULATOR DEVICE

[75] Inventors: Juergen A. Foerstner, Mesa; Wen-Ling M. Huang; Marco Racanelli, both of Phoenix, all of Ariz.

[73] Assignee: Motorola, Inc., Schaumburg, Ill.

[21] Appl. No.: 642,134

[22] Filed: May 2, 1996

[51] Int. Cl.⁶ .................. H01L 21/8249; H01L 21/84
[52] U.S. Cl. .................. 438/155; 438/165; 438/236; 438/311; 438/412
[58] Field of Search .................. 438/155, 164, 438/165, 202, 204, 207, 234, 236, 311, 355, 343, 349, 404, 412, 167, 222; 257/350, 353, 378, 370

[56] References Cited

U.S. PATENT DOCUMENTS

| | | | |
|---|---|---|---|
| 5,013,681 | 5/1991 | Godbey et al. | |
| 5,047,356 | 9/1991 | Li et al. | 437/21 |
| 5,087,580 | 2/1992 | Eklund | 438/155 |
| 5,100,810 | 3/1992 | Yoshimi et al. | 438/155 |
| 5,116,771 | 5/1992 | Karlukar | 437/40 |
| 5,273,915 | 12/1993 | Huang et al. | 438/155 |
| 5,279,978 | 1/1994 | See et al. | 438/155 |
| 5,364,800 | 11/1994 | Joyner | |
| 5,439,836 | 8/1995 | Giffard | |
| 5,567,966 | 10/1996 | Hwang | 257/350 |

FOREIGN PATENT DOCUMENTS

| | | | |
|---|---|---|---|
| 59-99772 | 6/1984 | Japan | |
| 4-69966 | 3/1992 | Japan | |
| 4-113677 | 4/1992 | Japan | |
| 5-90589 | 4/1993 | Japan | |
| 5-243510 | 9/1993 | Japan | 257/350 |
| 5-259457 | 10/1993 | Japan | 438/155 |
| 6-85177 | 3/1994 | Japan | |

*Primary Examiner*—Charles L. Bowers, Jr.
*Assistant Examiner*—Leon Radomsky
*Attorney, Agent, or Firm*—Rennie William Dover; Ziye Zhou

[57] ABSTRACT

A semiconductor on insulator structure (50) includes a silicon layer (30) formed on an insulating substrate (20). The silicon layer (30) is partitioned into two sections (32, 34) which are electrically isolated from each other. The thickness of the silicon layer (30) in a first section (32) of the silicon layer (30) is adjusted independently from the thickness of the silicon layer (30) in a second section (34) of the silicon layer (30). Independently adjusting the thickness of the silicon layer (30) allows optimizing the performance of semiconductor devices (60, 80) fabricated in the first and second sections (32, 34) of the semiconductor on insulator structure (50).

16 Claims, 3 Drawing Sheets

METHOD FOR FABRICATING A SEMICONDUCTOR ON INSULATOR DEVICE

BACKGROUND OF THE INVENTION

The present invention relates, in general, to fabricating a semiconductor device and, more particularly, to fabricating a semiconductor device using a semiconductor on insulator substrate.

In very large scale integrated (VLSI) circuits, semiconductor on insulator and, more particularly, thin film silicon on insulator (TFSOI) technology is used to achieve greater isolation between devices without reducing available chip area. TFSOI substrates are typically used for fabricating high speed devices that are resistant to latch up and are radiation hardened. In a TFSOI process, the silicon layer of a TFSOI substrate is partitioned into a plurality of sections and a device is fabricated in each section.

For example, in a TFSOI bipolar complementary metal oxide semiconductor (BiCMOS) process, bipolar transistors and insulated gate field effect transistors (IGFETS) are fabricated in different sections of a TFSOI substrate. Although the bipolar transitors and IGFETS are fabricated in different sections of the TFSOI substrate, they undergo similar processing. Thus, the thickness of the silicon layer in the different sections remains substantially constant. As those skilled in the art are aware, the performance of a bipolar transistor may be improved by using a thicker silicon layer in the base and emitter regions and the performance of an IGFET may be improved by using a thinner silicon layer in the channel region. Accordingly, optimization of the IGFET performance may compromise the performance of the bipolar transistor, while optimization of the bipolar transistor performance may compromise the performance of the IGFET. In addition, when down-scaling the TFSOI structure, the bipolar transistor may lose its current conducting capacity because the silicon layer at the emitter-base junction of the bipolar transistor is too thin for efficient injection of carriers from the emitter to the base.

One technique for optimizing both bipolar and IGFET devices in a TFSOI substrate involves differentially thinning the semiconductor layer at the beginning of the fabrication process. However, the differential thinning process usually requires an extra masking step as well as steps for optimizing the isolation oxide, and therefore is complicated.

Accordingly, it would be advantageous to have a semiconductor device and a process for fabricating the semiconductor device. It is desirable for the process to be capable of independently thinning different sections of a semiconductor layer. It is also desirable for the process to be simple and easily integrated into existing semiconductor processes.

DETAILED DESCRIPTION OF THE DRAWINGS

Figure 1:
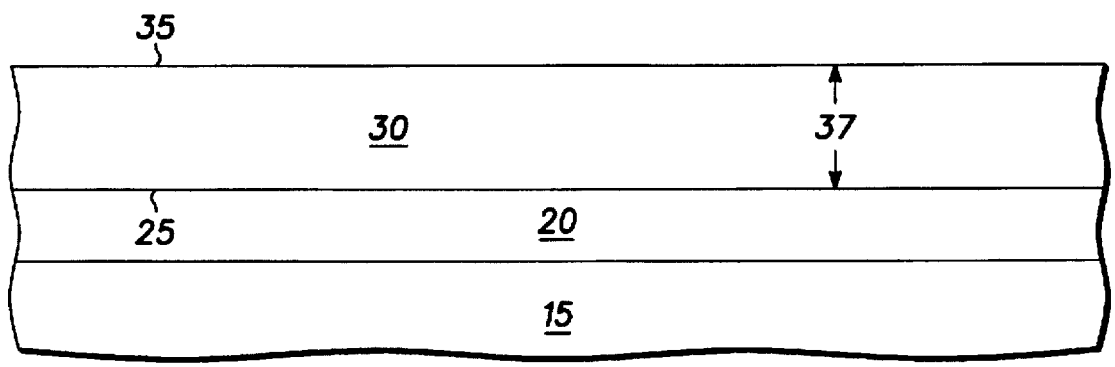
FIG. 1 is an enlarged cross-sectional view of a semiconductor on insulator substrate such as would be used to fabricate a semiconductor device in accordance with the present invention.

FIG. 1 is an enlarged cross-sectional view of a semiconductor on insulator (SOI) substrate 10 such as would be used to fabricate a semiconductor device in accordance with the present invention. Substrate 10 includes a substrate layer 15, which has an insulating layer 20 formed thereon. Insulating layer 20 has a major surface 25 and is also referred to as an insulating substrate. A semiconductor layer 30 is formed on major surface 25. By way of example, semiconductor layer 30 is a silicon layer and insulating layer 20 is a silicon dioxide layer. Silicon layer 30 has a surface 35 and a thickness of, for example, 180 nanometers (nm). The thickness of silicon layer 30 is indicated by arrows 37 and is measured from surface 35 of silicon layer 30 to major surface 25 of insulating layer 20. SOI substrate 10 can be formed using any of the conventional processes known in the art such as, for example, oxygen implantation or direct wafer bonding and thinning.

Semiconductor devices are fabricated in silicon layer 30 of substrate 10. Different devices are usually fabricated in different sections of silicon layer 30. A process in accordance with an embodiment of the present invention for independently adjusting the thickness in different sections of silicon layer 30 is described with reference to FIGS. 2-6.

Figure 2:
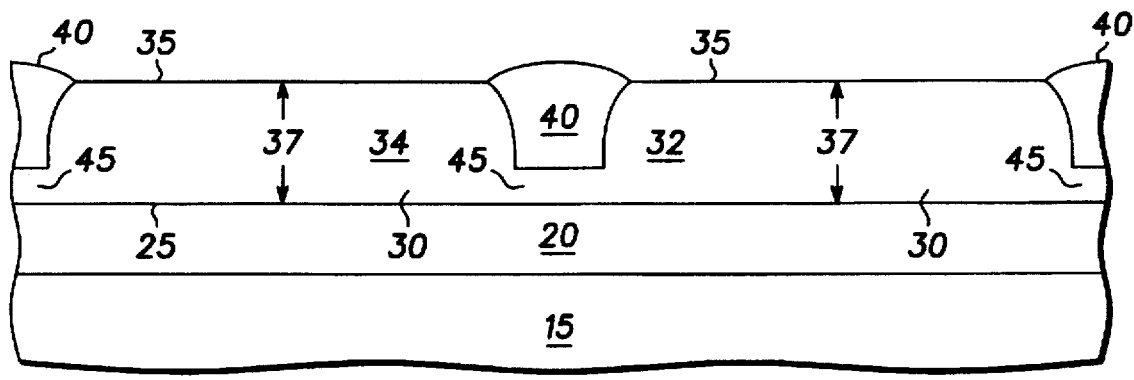
FIGS. 2-6 are enlarged cross-sectional views of a semiconductor on insulator structure in accordance with the present invention at various stages of fabrication.

FIG. 2 is an enlarged cross-sectional view of an SOI structure 50 at an early stage of fabrication in accordance with the present invention. SOI structure 50 is fabricated from SOI substrate 10 of FIG. 1. It should be noted that the same reference numbers are used in the figures to represent the same elements. Silicon layer 30 is partitioned into a plurality of sections 32 and 34 by isolation structures 40. Isolation structures 40 are a dielectric material formed in silicon layer 30 using a process such as, for example, a local oxidation of silicon isolation process or a poly-buffered local oxidation of silicon (PBL) isolation process. In order to avoid over-oxidation in subsequent steps of fabrication, isolation structures 40 preferably do not extend to the bottom of silicon layer 30. In other words, there are regions 45 of silicon between isolation structures 40 and major surface 25. It should be noted that, although only two sections 32 and 34 are shown in FIG. 2, this is not a limitation of the present invention. Silicon layer 30 may be partitioned into any number of sections or regions.

Figure 3:
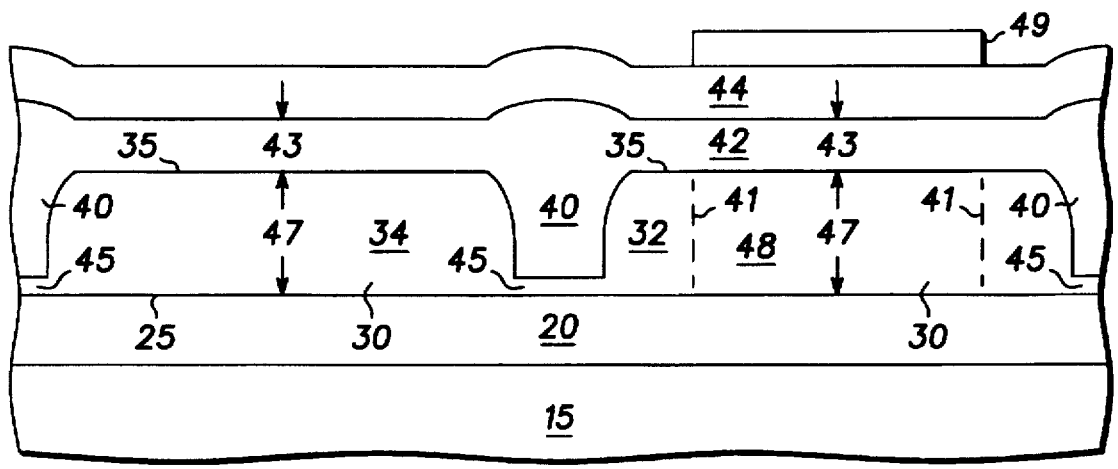

Now referring to FIG. 3, an oxide layer 42 is formed over silicon layer 30 by, for example, oxidizing the silicon in silicon layer 30. Oxide layer 42 has a thickness indicated by arrows 43. As those skilled in the art are aware, oxidizing a silicon layer consumes a portion of the silicon layer. Thus, silicon layer 30 becomes thinner and has a thickness indicated by arrows 47. The oxidation process also consumes the silicon in regions 45 between isolation structures 40 and major surface 25. Therefore, regions 45 become thinner after forming oxide layer 42. It should be noted that the surface of silicon layer 30 after the oxidation is still indicated by reference number 35. By way of example, oxide layer 42 has a thickness of approximately 60 nm and silicon layer 30 is thinned to have a thickness of approximately 150 nm.

A layer 44 of nitride is deposited over oxide layer 42. A masking layer 49 such as, for example, a photoresist layer, is formed on nitride layer 44. Masking layer 49 is patterned for covering and protecting nitride layer 44 and oxide layer 42 over a portion 48 of silicon layer 30 using photolithographic techniques well known to those skilled in the art. It should be noted that portion 48 is the region laterally bounded by broken lines 41 in section 32. Masking layer 49 overlies portion 48 of section 32 and is absent from section 34.

Figure 4:
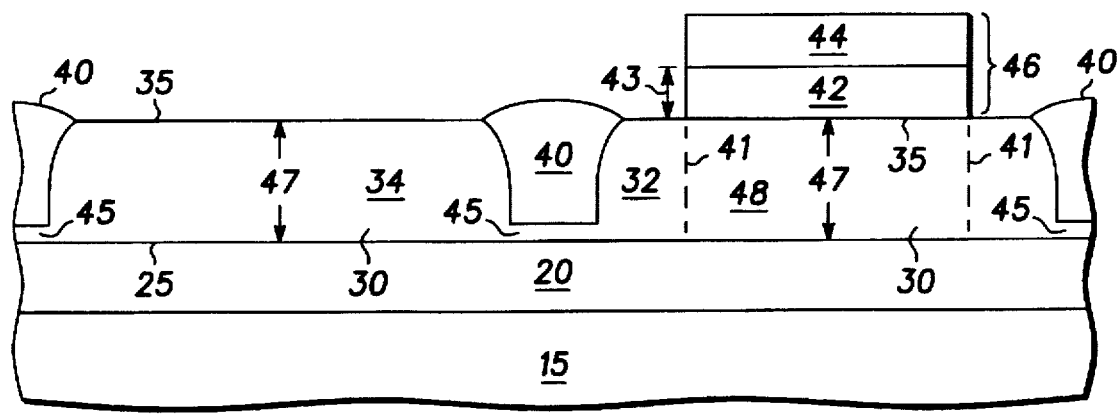

FIG. 4 is an enlarged cross-sectional view of SOI structure 50 at a subsequent stage of fabrication in accordance with the present invention. The portions of nitride layer 44 and oxide layer 42 in the regions which are not covered or protected by masking layer 49 are removed using, for example, reactive ion etching. After the etching process, the remaining portions of oxide layer 42 and nitride layer 44 form a butte structure 46. After etching, masking layer 49 is removed using techniques known in the art. It should be noted that removing oxide layer 42 is optional. In an alternative embodiment, the etching process only removes nitride layer 44 in the regions unprotected by masking layer 49.

Figure 5:
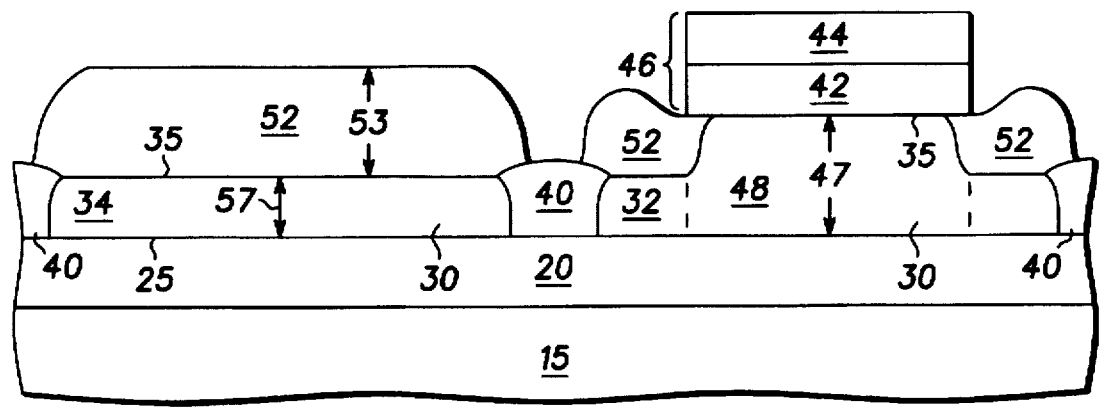

Referring now to FIG. 5, a layer 52 of oxide is formed over the exposed portions of surface 35 by, for example, oxidization. The portion of oxide layer 52 that overlies section 34 of silicon layer 30 has a thickness indicated by arrows 53. Formation of oxide layer 52 consumes the portions of silicon layer 30 unprotected by butte structure 46. Thus, silicon layer 30 in portions of section 32 that are adjacent portion 48 and silicon layer 30 in section 34 are thinned and have a thickness indicated by arrows 57. It should be noted that the surface of silicon layer 30 in the thinned portions is still indicated by reference number 35. The oxidation process also consumes the silicon in regions 45 between isolation structures 40 and major surface 25. Preferably, the oxidation process which forms oxide layer 52 completely consumes regions 45, i.e., regions 45 of silicon are absent in silicon layer 30 after forming oxide layer 52. Thus, section 32 of silicon layer 30 is completely isolated from section 34 of silicon layer 30. By way of example, the portion of oxide layer 52 over section 34 of silicon layer 30 has a thickness of approximately 150 nm and the thinned portion of silicon layer 30 has a thickness of approximately 75 nm.

Figure 6:
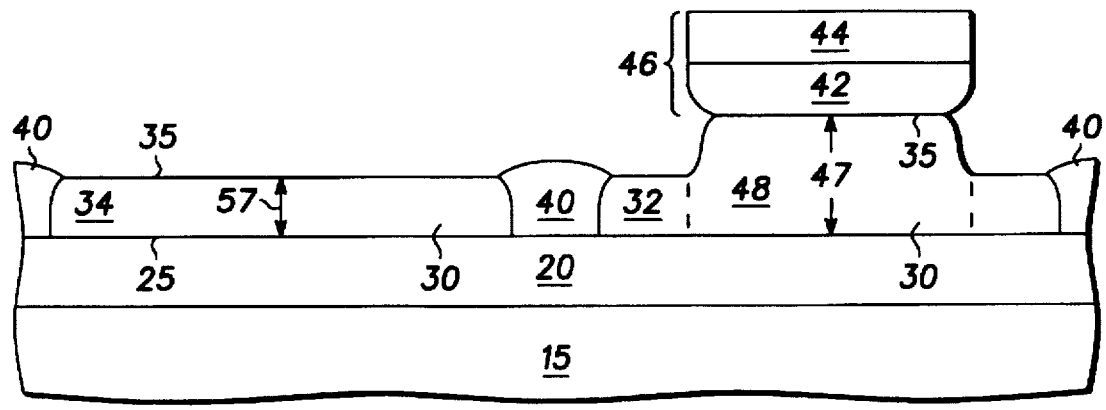

FIG. 6 is an enlarged cross-sectional view of SOI structure 50 at a subsequent stage of fabrication in accordance with the present invention. Oxide layer 52 is etched away using an etchant that has a higher etch selectivity for oxide compared to nitride. Thus, nitride layer 44 and oxide layer 42 remain over portion 48 of silicon layer 30 after oxide layer 52 is etched away.

It should be understood that the thickness of silicon layer 30 and the thickness of oxide layers 42 and 52 at the various stages of fabrication are not limited to those described with reference to FIGS. 1–6. The present invention provides a process for independently controlling the thickness of the silicon area in different regions. Depending on the types of the semiconductor devices to be fabricated, the thickness of silicon layer 30 and the thickness of oxide layers 42 and 52 vary from process to process.

Figure 7:
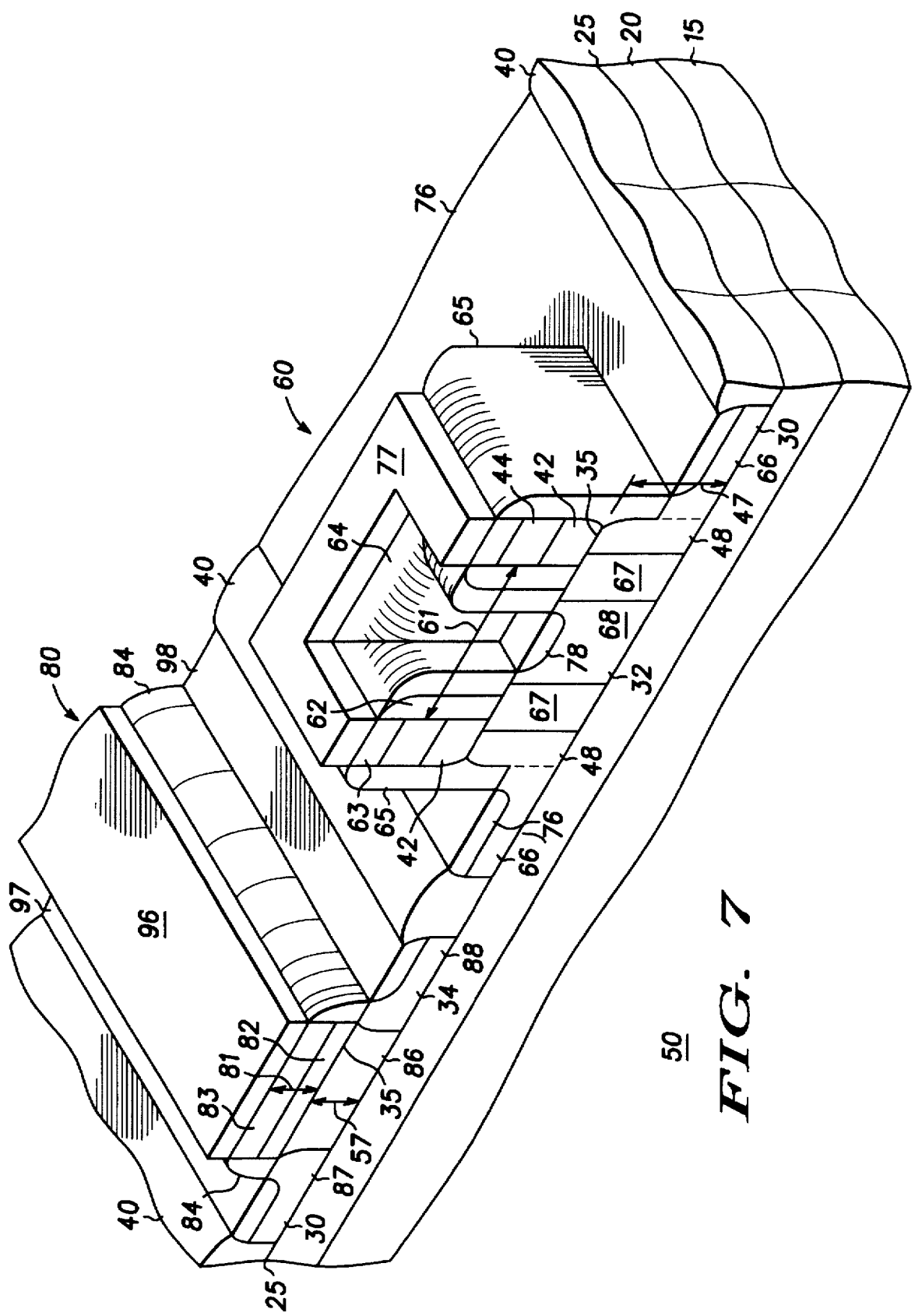
FIG. 7 is an enlarged cross-sectional isometric view of a semiconductor on insulator bipolar-field effect transistor structure in accordance with the present invention.

SOI structure 50 of FIG. 6 is subsequently used to fabricate semiconductor devices in sections 32 and 34 of silicon layer 30. Devices that can be fabricated in silicon layer 30 include field effect transistors, bipolar transistors, resistors, capacitors, inductors, etc. As an example, FIG. 7 illustrates an enlarged cross-sectional isometric view of a bipolar transistor 60 and a field effect transistor (FET) 80 manufactured using SOI structure 50 of FIG. 6. It should be noted that the same reference numbers are used in the figures to represent the same elements.

Bipolar transistor 60 is formed in section 32 of silicon layer 30. By way of example, bipolar transistor 60 is an NPN bipolar transistor. To form bipolar transistor 60, a dopant of n-type conductivity such as, for example, phosphorus, is implanted into section 32 of silicon layer 30. This implant forms a collector region 66. The energy and dose of the implanted phosphorus ions are adjusted so that the silicon material in section 32 has a bulk dopant concentration ranging from, for example, approximately $10^{15}$ atoms per cubic centimeter (atoms/cm$^3$) to approximately $10^{18}$ atoms/cm$^3$. A conductive layer such as, for example, a polycrystalline silicon layer 63 of p-type conductivity, is formed on nitride layer 44. An opening 61 is formed in polycrystalline silicon layer 63, nitride layer 44, and oxide layer 42, thereby exposing a segment, or a sub-portion, of the silicon area within portion 48. A conductive structure such as, for example, a polycrystalline silicon spacer 62 of p-type conductivity, is formed along the edge of opening 61. Polycrystalline silicon spacer 62 extends from polycrystalline silicon layer 63 to surface 35 of silicon layer 30. A dopant of p-type conductivity such as, for example, boron, is implanted into portion 48 within section 32 to form an active base region 67. The energy and dose of the implanted boron ions are adjusted so that the silicon material in portion 48 has a dopant concentration ranging from, for example, approximately $10^{16}$ atoms/cm$^3$ to approximately $10^{19}$ atoms/cm$^3$. Active base region 67 is in contact with polycrystalline silicon spacer 62 and is, therefore, electrically coupled to polycrystalline silicon layer 63. Polycrystalline silicon spacer 62 and polycrystalline silicon layer 63 form an extrinsic base region of bipolar transistor 60. An insulating structure such as an oxide spacer 64 is formed on polycrystalline silicon spacer 62. Likewise, an oxide spacer 65 is formed adjacent the edge of polycrystalline silicon layer 63, nitride layer 44, and oxide layer 42. A dopant of n-type conductivity such as, for example, phosphorus, is implanted into silicon layer 30 in a region within portion 48 to form an emitter region 68. The energy and dose of the implanted phosphorus ions are adjusted so that the silicon material in the region has a dopant concentration ranging from, for example, approximately $10^{17}$ atoms/cm$^3$ to approximately $10^{21}$ atoms/cm$^3$. The emitter-base junction is shown in FIG. 7 as the boundary between emitter region 68 and active base region 67 and has a thickness of approximately 150 nm. Bipolar transistor 60 further includes a collector electrode 76 coupled to collector region 66, a base electrode 77 coupled to active base region 67 via polycrystalline silicon layer 63 and polycrystalline silicon spacer 62, and an emitter electrode 78 coupled to emitter region 68. By way of example, collector electrode 76, base electrode 77, and emitter electrode 78 are silicide structures.

Although FIG. 7 shows bipolar transistor 60 having a ring structure with emitter region 68 surrounded by base region 67 and base region 67 surrounded by collector region 66, this is not intended as a limitation of the present invention. For example, bipolar transistor 60 may also have a bar structure with a base region in the middle of the structure, and an emitter region and a collector region at the two opposite ends of the structure that are contiguous with the base region. Preferably, the emitter-base junction of the bipolar transistor is located within portion 48.

FET 80 is formed in section 34 of silicon layer 30. By way of example, FET 80 is an n-channel insulated gate FET. To form FET 80, a dopant of p-type conductivity such as, for example, boron, is implanted into section 34 of silicon layer 30. The energy and dose of the implanted boron ions are adjusted so that the silicon material in section 34 has a dopant concentration ranging from, for example, approximately $10^{15}$ atoms/cm$^3$ to approximately $10^{18}$ atoms/cm$^3$. A dielectric layer 82 is formed on surface 35 of silicon layer 30. A conductive layer such as, for example, a polycrystalline silicon layer 83 of n-type conductivity, is formed on dielectric layer 82. Dielectric layer 82 and polycrystalline silicon layer 83 form a gate structure 81 of FET 80.

Insulating structures such as, for example, oxide spacers 84, are formed adjacent gate structure 81. A dopant of n-type conductivity such as, for example, phosphorus, is implanted into silicon layer 30 adjacent spacers 84 to form source and drain regions 87 and 88, respectively, of FET 80. The energy and dose of the implanted phosphorus ions are adjusted so that silicon layer 30 in the regions adjacent spacers 84 have a dopant concentration ranging from, for example, approximately $10^{18}$ atoms/cm$^3$ to approximately $10^{21}$ atoms/cm$^3$. A region below gate structure 81 serves as a channel region 86 of FET 80. Channel region 86 has a thickness of approximately 75 nm. FET 80 further includes a gate electrode 96 coupled to polycrystalline silicon layer 83, a source electrode 97 coupled to source region 87, and a drain electrode 98 coupled to drain region 88. By way of example, gate electrode 96, source electrode 97, and drain electrode 98 are silicide structures.

By now it should be appreciated that a process and a structure for fabricating a semiconductor device have been provided. In accordance with the present invention, the thickness of the semiconductor layer in one section of an SOI structure can be set independently of the thickness of the semiconductor layer in another section of the SOI structure. In other words, the thickness of the semiconductor layer in each section of the SOI structure is independently controllable. This allows for optimizing one device, e.g., a bipolar transistor, independently of another device, e.g., a FET. Another advantage of the present invention is that the process does not require extra masking steps or optimization of isolation oxide for differentially thinning the semiconductor layer. Thus, the process is simple and easily integrated into existing semiconductor processes. Further, the present invention is suitable for manufacturing other types of semiconductor device structures including FET-FET structures, bipolar-bipolar structures, FET-capacitor structures, bipolar-resistor structures, etc.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the silicon on insulator layer may be silicon on sapphire.

We claim:

1. A method for thinning a semiconductor on insulator substrate, comprising the steps of:

providing the semiconductor on insulator substrate which has a semiconductor layer formed on an insulating layer, the semiconductor layer having a first thickness;

forming a first layer of oxide over the semiconductor layer;

depositing a layer of nitride over the first layer of oxide;

forming a butte by removing a portion of the layer of nitride that overlies a first portion of the semiconductor layer;

forming a second layer of oxide on the first portion of the semiconductor layer, the second layer of oxide partially consuming the first portion of the semiconductor layer, so that the first portion of the semiconductor layer is thinner than a second portion of the semiconductor layer under the butte;

removing the second layer of oxide while preserving the butte; and forming a conductive structure along an edge of the butte and contacting the second portion of the semiconductor layer under the butte.

2. The method of claim 1, wherein the step of forming a butte further includes the steps of:

forming a masking layer on the layer of nitride, wherein the masking layer overlies the second portion of the semiconductor layer; and etching away the portion of the layer of nitride unprotected by the masking layer.

3. The method of claim 1, wherein the step of forming a butte further includes removing the first layer of oxide that overlies the first portion of the semiconductor layer.

4. The method of claim 1, wherein the step of forming a first layer of oxide further includes oxidizing the semiconductor layer so that the semiconductor layer has a second thickness which is less than the first thickness.

5. The method of claim 4, wherein the step of forming a second layer of oxide further includes oxidizing the first portion of the semiconductor layer so that the first portion of the semiconductor layer has a third thickness which is less than the second thickness.

6. The method of claim 1, further comprising the step of forming a local oxidation isolation structure to electrically isolate the first portion of the semiconductor layer from the second portion of the semiconductor layer under the butte.

7. The method of claim 6, further comprising the steps of:

forming a first semiconductor device in the first portion of the semiconductor layer; and forming a second semiconductor device in the second portion of the semiconductor layer under the butte.

8. A method for fabricating a semiconductor on insulator device, comprising the steps of:

providing a semiconductor layer disposed on a major surface of an insulating substrate, the semiconductor layer having a first thickness;

partitioning the semiconductor layer into a first section and a second section, wherein the first section is electrically isolated from the second section;

oxidizing the first and second sections of the semiconductor layer to form an oxide layer that overlies the first and second sections of the semiconductor layer, so that the first and second sections of the semiconductor layer have a second thickness which is less than the first thickness;

depositing a nitride layer on the oxide layer over the first and second sections of the semiconductor layer;

covering a first portion of the nitride layer overlying a first portion of the first section of the semiconductor layer with a masking layer;

forming a butte by removing a second portion the nitride layer that is uncovered by the masking layer;

thinning a second portion of the first section of the semiconductor layer adjacent the first portion of the first section and the second section of the semiconductor layer, so that the second portion of the first section and the second section of the semiconductor layer have a third thickness which is less than the second thickness;

forming a first semiconductor device under the butte in the first section of the semiconductor layer;

forming a second semiconductor device in the second section of the semiconductor layer; and forming a conductive structure along an edge of the butte and contacting the first portion of the first section of the semiconductor layer under the butte.

9. The method of claim 8, wherein the step of partitioning the semiconductor layer into a first section and a second section further includes the step of forming a poly-buffered local oxidation isolation structure extending from a first surface of the semiconductor layer to the major surface of the insulating substrate.

10. The method of claim 8, wherein the step of forming a butte further includes removing a portion of t he oxide layer under the second portion of the nitride layer.

11. The method of claim 8, wherein the step of forming a first semiconductor device under the butte in the first section of the semiconductor layer further includes the step of forming a bipolar transistor under the butte.

12. The method of claim 11, wherein the step of forming a bipolar transistor includes the steps of:

implanting ions of a first type conductivity into the first section of the semiconductor layer;

forming a conductive layer on the nitride layers;

forming an opening in the conductive layer, the nitride layer, and the oxide layer that overlie a segment of the first portion of the first section of the semiconductor layer;

implanting ions of a second type conductivity into the first portion of first section of the semiconductor layer;

forming the conductive structure along an edge of the opening in the conductive layer, the nitride layer, and the oxide layer, the conductive structure contacting the semiconductor layer of the second type conductivity under the butte;

implanting ions of the first type conductivity into the segment of the first portion of first section of the semiconductor layer;

forming an emitter electrode on the segment of the first portion of first section of the semiconductor layer;

forming a collector electrode on the second portion of first section of the semiconductor layer; and forming a base electrode coupled to the conductive layer.

13. The method of claim 12, wherein the step of forming a conductive layer further includes the step of forming a polycrystalline semiconductor layer of the second type conductivity, and wherein the step of forming the conductive structure further includes the step of forming a polycrystalline semiconductor spacer of the second type conductivity alone the edge of the butte.

14. The method of claim 8, wherein the step of forming a second semiconductor device in the second section of the semiconductor layer further includes the step of forming a field effect transistor.

15. The method of claim 14, wherein the step of forming a field effect transistor includes the steps of:

implanting ions of a first type conductivity into the second section of the semiconductor layer;

forming a gate structure over a portion of the second section of the semiconductor layer, the gate structure having a first edge and a second edge;

forming a source region in the second section of the semiconductor layer adjacent the first edge of the gate structure, the source region of a second type conductivity; and forming a drain region in the second section of the semiconductor layer adjacent the second edge of the gate structure, the drain region of the second type conductivity.

16. The method of claim 15, wherein the step of forming a gate structure further includes the steps of:

forming a dielectric layer over the portion of the second section of the semiconductor layer; and forming a polycrystalline semiconductor layer of the second type conductivity on the dielectric layer.

* * * * *